United States Patent
Swnson et al.

(10) Patent No.: US 7,084,500 B2
(45) Date of Patent: Aug. 1, 2006

(54) SEMICONDUCTOR CIRCUIT WITH MULTIPLE CONTACT SIZES

(75) Inventors: Leland Swnson, McKinney, TX (US); Gregory Eric Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/696,017

(22) Filed: Oct. 29, 2003

(65) Prior Publication Data
US 2005/0093151 A1    May 5, 2005

(51) Int. Cl.
*H01L 29/40* (2006.01)
*H01L 23/58* (2006.01)

(52) U.S. Cl. ............... 257/738; 257/691; 257/693; 257/775; 438/613

(58) Field of Classification Search ........ 257/737–738, 257/778, 691, 693, 786, 774–775; 228/180.22; 438/613
See application file for complete search history.

(56) References Cited

U.S. PATENT DOCUMENTS

| | | | | |
|---|---|---|---|---|
| 4,764,804 A | * | 8/1988 | Sahara et al. ............... 257/717 |
| 5,214,308 A | * | 5/1993 | Nishiguchi et al. ......... 257/692 |
| 5,291,062 A | | 3/1994 | Higgina III ................. 257/698 |
| 5,569,960 A | * | 10/1996 | Kumazawa et al. ........ 257/738 |
| 5,642,261 A | | 6/1997 | Bond et al. ................. 361/704 |
| 5,672,542 A | * | 9/1997 | Schwiebert et al. ........... 438/4 |
| 5,751,060 A | | 5/1998 | Laine et al. ................. 257/702 |
| 5,798,567 A | * | 8/1998 | Kelly et al. ................. 257/723 |
| 5,991,156 A | | 11/1999 | Bond et al. ................. 361/707 |
| 6,011,694 A | | 1/2000 | Hirakawa ................... 361/774 |
| 6,222,277 B1 | * | 4/2001 | Downes ...................... 257/778 |
| 6,255,699 B1 | * | 7/2001 | Bracchitta et al. .......... 257/369 |
| 6,316,822 B1 | | 11/2001 | Venkateshwaran et al. . 257/666 |
| 6,410,861 B1 | | 6/2002 | Huang et al. ............... 174/260 |
| 6,563,712 B1 | | 5/2003 | Akram et al. ............... 361/719 |
| 6,580,169 B1 | * | 6/2003 | Sakuyama et al. .......... 257/738 |
| 6,780,023 B1 | | 8/2004 | Miyagawa ................... 439/68 |

OTHER PUBLICATIONS

U.S. Appl. No. 10/453,445, Swanson et al. filed Jun. 3, 2003 "Semiconductor Circuit with Multiple Contact Sizes".

* cited by examiner

*Primary Examiner*—Jasmine Clark
(74) *Attorney, Agent, or Firm*—Yingsheng Tung; Wade James Brady, III; Frederick J. Telecky, Jr.

(57) ABSTRACT

A semiconductor circuit comprising a semiconductor die and a package substrate. In one embodiment, a first plurality of conductive bumps serves as a portion of a conductive path between contacts on the semiconductor die and contacts on the package substrate. A second plurality of conductive bumps serves as a portion of a conductive path between other contacts on the die and contacts on the package substrate. Each of the bumps in the first plurality of conductive bumps is larger than each of the bumps in the second plurality of conductive bumps. In another embodiment, the average size of the first plurality of conductive bumps may be at least 20% larger (or greater) than the average size of the second plurality of bumps.

7 Claims, 2 Drawing Sheets

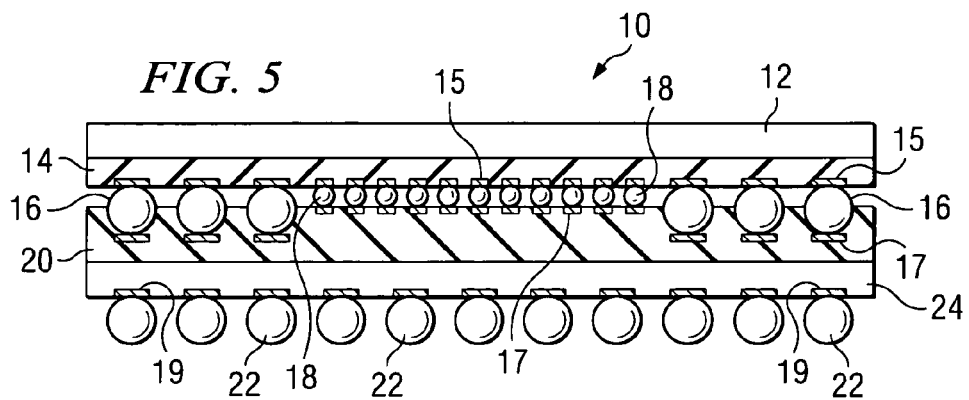
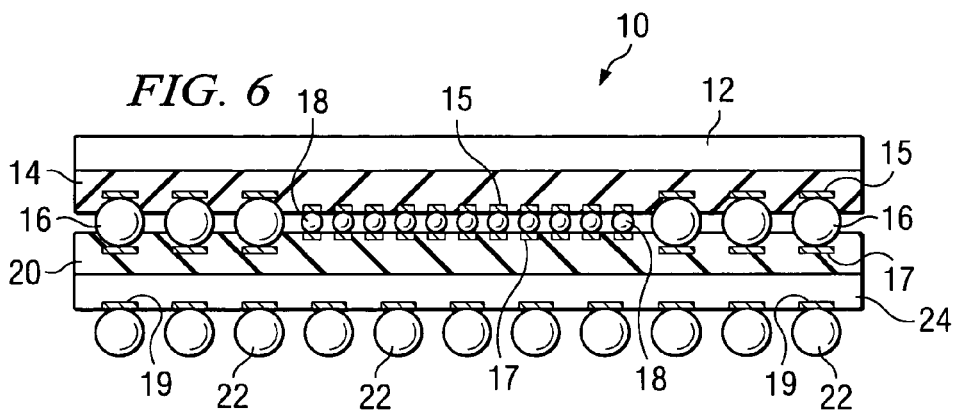
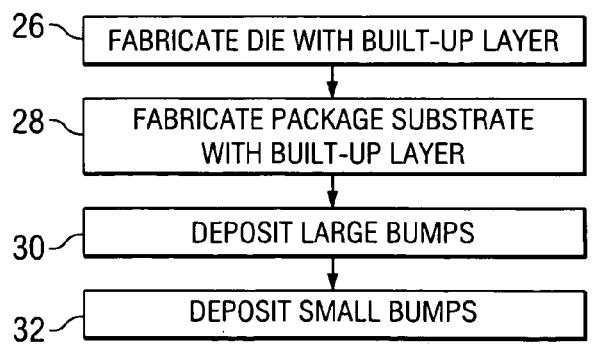

SEMICONDUCTOR CIRCUIT WITH MULTIPLE CONTACT SIZES

CROSS REFERENCE TO RELATED APPLICATIONS

This application is related to U.S. application Ser. No. 10/453,445 filed on Jun. 3, 2003, by Leland Swanson and Gregory Howard and entitled, "USING SOLDER BALLS OF MULTIPLE SIZES TO COUPLE ONE OR MORE SEMICONDUCTOR STRUCTURES TO AN ELECTRICAL DEVICE."

TECHNICAL FIELD OF THE INVENTION

The present invention relates to semiconductor packaging and more particularly to a semiconductor circuit with multiple contact sizes and a method for manufacturing the same.

BACKGROUND OF THE INVENTION

The size of semiconductor die designs continues to increase. As the size of semiconductor dies increase, in operation, semiconductor circuits employing such dies, normally consume higher amounts of power and current than previous integrated circuits incorporating smaller size dies. High current flow may cause electro-migration problems either in connection with the contacts for connecting an array package to a printed circuit board or within the contacts for connecting a flip chip die to a substrate within an array package (or directly to a printed circuit board in the case of a wafer scale application). To address these issues, one existing solution has been to include multiple contacts on either a die or semiconductor circuit array package for power and ground connections. However, adding inputs and outputs increases the complexity of routing within built up layers both on the package substrate and on the die. Increasing the complexity of routing leads to more expensive packaging.

Larger die designs have also increased the number of inputs and outputs to a semiconductor circuit. As a result, bump, ball, pin, and/or column sizes have decreased in array packages. Because smaller contacts are more likely to break off when a printed circuit board or semiconductor circuit is subjected to mechanical forces (such as when a circuit board is dropped) large die designs with small contacts are also more fragile than existing designs with larger contacts.

SUMMARY OF THE INVENTION

One aspect of the invention is a semiconductor circuit comprising a semiconductor die and a package substrate. In one embodiment, a first plurality of conductive bumps serves as a portion of a conductive path between contacts on the semiconductor die and contacts on the package substrate. A second plurality of conductive bumps serves as a portion of a conductive path between other contacts on the die and contacts on the package substrate. Each of the bumps in the first plurality of conductive bumps is larger than each of the bumps in the second plurality of conductive bumps. In another embodiment, the average size of the first plurality of conductive bumps may be at least 20% larger (or greater) than the average size of the second plurality of bumps.

The invention has several important technical advantages. Various embodiments of the invention may have none, some, or all of these advantages as well as additional advantages. The invention may reduce problems with electro-migration and increased complexity of routing by providing larger contacts (bumps, balls, pins, or columns) for inputs or outputs to the semiconductor circuit which experience higher current than other inputs and outputs. For example, while the invention is not limited to using larger contacts for power and ground inputs and outputs, the use of larger contacts for power and/or ground inputs or outputs may decrease the need to have multiple power and ground inputs and simplify routing. In addition, the use of a larger contact size may provide better mechanical support for the semiconductor circuit when mounted on a printed circuit board either directly (as in a wafer scale application) or indirectly (when used in an array package). Thus, the invention may improve the durability of large die semiconductor circuits while still accommodating a large number of inputs and outputs.

BRIEF DESCRIPTION OF THE DRAWINGS

For a more complete understanding of the present invention and the advantages thereof, reference is now made to the following descriptions taken in conjunction with the accompanying drawings in which:

FIG. 5 illustrates a fifth embodiment of the invention in which bumps are positioned in holes in a built up layer on a package substrate.

FIG. 6 illustrates a sixth embodiment of the invention in which bumps are positioned in holes in both a built up layer on a semiconductor die and a package substrate.

FIG. 7 illustrates a flowchart of a process to manufacture a semiconductor circuit in accordance with the invention.

DETAILED DESCRIPTION OF EXAMPLE EMBODIMENTS OF THE INVENTION

Preferred embodiments of the present invention and advantages thereof are best understood by referring now to FIGS. 1 through 4 of the drawings, like numerals being used for like in corresponding parts of the various drawings.

Figure 1:
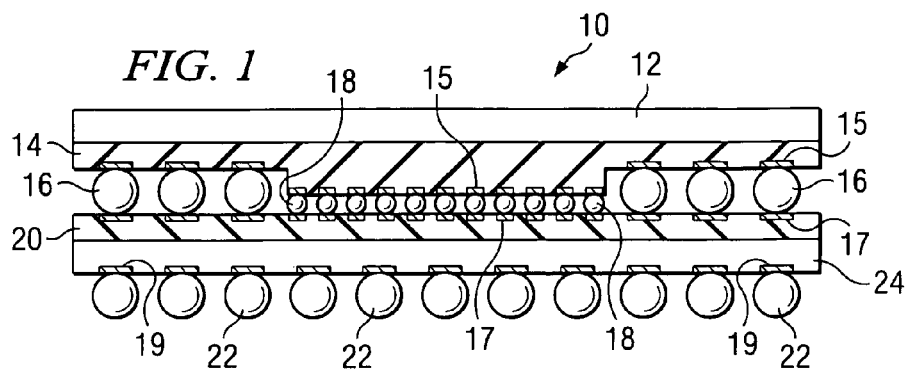
FIG. 1 illustrates an example of one embodiment of a semiconductor circuit constructed in accordance with the invention.

FIG. 1 illustrates a cross sectional view of a semiconductor circuit 10 constructed in accordance with the invention. Semiconductor circuit 10 comprises die 12, built up layer 14, large bumps 16, small bumps 18, built up layer 20, conductive pads 15, conductive pads 17, contacts 19, ball contacts 22, and package substrate 24.

In this embodiment of the invention, multiple bump sizes are used to electrically connect die 12 to package substrate 24. Conductive pads 15 (also referred to as contacts) on built up layer 14 are connected to conductive pads 17 (also referred to as contacts) on built up layer 20. Some contacts 15 on built up layer 14 are connected to contacts 17 on built up layer 20 through large bumps 16 while others are connected using small bumps 18. Thus, large bumps 16 and small bumps 18 form at least part of a conductive path between die 12 and package substrate 24. While the contacts 15, 17 connected by large bumps 16 and small bumps 18 are on built-up layers associated with die 12 and package substrate 24, in the terminology of the patent, the bumps are deemed to be connected to contacts on die 12 and/or package substrate 24.

The use of multiple bump sizes to electrically connect die 12 to package substrate 24 may advantageously allow the use of larger bumps 16 for high current and/or high power inputs or outputs. For example, large bumps 16 may be useful for power and/or ground connections. However, large bumps 16 could be used for any input or output to die 12 without departing from the scope of the invention. The use of large bumps 16 may also increase the durability of semiconductor circuit 10 as compared to an integrated circuit with bumps which are all substantially the same size as small bumps 18.

In this embodiment, built up layer 14 may comprise a built up layer constructed using conventional techniques or other suitable techniques for such layers. However, built up layer 14 may be thicker in the area where small bumps 18 are used to connect die 12 to package substrate 24 and thinner in the areas where large bumps 16 are used to connect die 12 to package substrate 24. By constructing built up layer 14 in this manner, the surfaces of large bumps 16 and small bumps 18 that are bonded to built up layer 20 may be substantially coplanar such that adequate bonds may be obtained for all large bumps 16 and small bumps 18 functioning as inputs and outputs. The invention may be implemented using many options. For example, rather than using large bumps 16 and small bumps 18 to electrically connect die 12 to package substrate 24, large balls and small balls could be used instead. Large pins and small pins as well as large columns and small columns could also be used. Where advantageous, a mixture of the above (e.g. large balls and small bumps) could also be used without departing from the scope of the invention.

Semiconductor circuit 10 comprises a ball grid array as illustrated, because ball contacts 22 are used on the bottom of package substrate 24. However, the invention may be used in connection with a pin grid array, column grid array, any kind of ball grid array (e.g. ceramic or plastic) or any other type of array packaging. Also, built up layer 20, package substrate 24, and ball contacts 22 could be omitted and the invention employed in a wafer scale application where die 12 is coupled to a printed circuit board using both large bumps 16 and small bumps 18.

As referred to in this patent, die 12 is connected to package substrate 24 (and in turn ball contacts 22) even though such connection may be indirect (for example through built up layers 14 and 20 and large bumps 16 and small bumps 18). Die 12 and package substrate 24 are still connected to one another because a conductive path extends from a ball contact 22 (and a conductive pad 19, which may also be referred to as a contact) through package substrate 24 and built up layer 20 through either a large bump 16 or small bump 18 through built up layer 14 to a contact in die 12. Thus, die 12 and package substrate 24 (as well as ball contacts 22) are connected to one another. This application may also use the term "coupled to" to describe this structural relationship. Intermediate components may be placed in the conductive path between die 12 and package substrate 24 (and/or ball contacts 22) without departing from the scope of the invention. Even where such additional structure is used, die 12 would still be deemed to be connected to and coupled to package substrate 24 (and ball contacts 22).

The term "contacts" may refer to ball contacts 22, small bumps 18 and large bumps 16. However, the term may also refer to conductive pads 15 on the bottom surface of die 12 and/or built up layer 14 that are connected to conductive pads 17 on built up layer 20 and/or package substrate 24 using large bumps 16 and/or small bumps 18.

In this embodiment, both package substrate 24 and die 12 have a built up layer on their entire surfaces. Built up layer 14 and/or built up layer 20 could be omitted without departing from the scope of the invention. In addition, a portion of built up layer 14 and/or built up layer 20 may be eliminated without departing from the scope of the invention such that built up layer 14 and/or built up layer 20 only extends over a portion of the surface of die 12 and/or package substrate 24.

Figure 2:
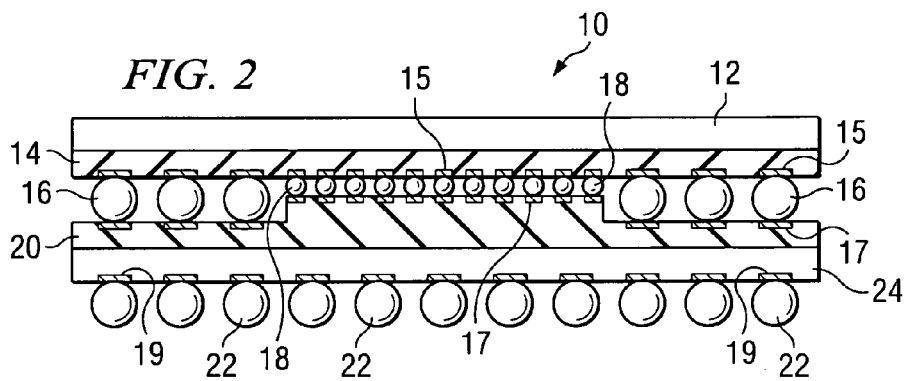
FIG. 2 illustrates a second embodiment of a semiconductor circuit manufactured in accordance with the invention.

FIG. 2 illustrates a second embodiment of a semiconductor circuit 10 constructed in accordance with the invention. The options discussed in connection with FIG. 1 are equally applicable to the embodiment illustrated in FIG. 2. Thus, the discussion below addresses the differences between the embodiment of FIG. 1 and FIG. 2.

In FIG. 1, built up layer 14 and die 12 had a non-uniform thickness so as to make the bottom surfaces of large bumps 16 and small bumps 18 substantially coplanar. By making large bumps 16 and small bumps 18 substantially coplanar, die 12 could be attached to package substrate 24 such that die 12 and package substrate 24 were substantially parallel after being bonded to one another.

In the embodiment of semiconductor circuit 10 illustrated in FIG. 2, however, built up layer 14 is substantially uniform in thickness while the thickness of built up layer 20 on package substrate 24 has been varied such that the top surfaces of large bumps 16 and small bumps 18 (the surfaces adjacent to built up layer 14) are substantially coplanar. This arrangement may also allow the connection of die 12 to package substrate 24 such that good connections are made between large bumps 16 and small bumps 18 from built up layer 14 to built up layer 20. This arrangement may also cause package substrate 24 to be substantially parallel to die 12 after connection has been made.

Note that in FIG. 2 (as in FIG. 1 and FIG. 3) large bumps 16 are located on the periphery of semiconductor circuit 10 while small bumps 18 are located in the interior. While this arrangement may be advantageous, it is not necessary and large bumps 16 can be placed anywhere on semiconductor circuit 10 without departing from the scope of the invention. The same is true for small bumps 18.

Figure 3:
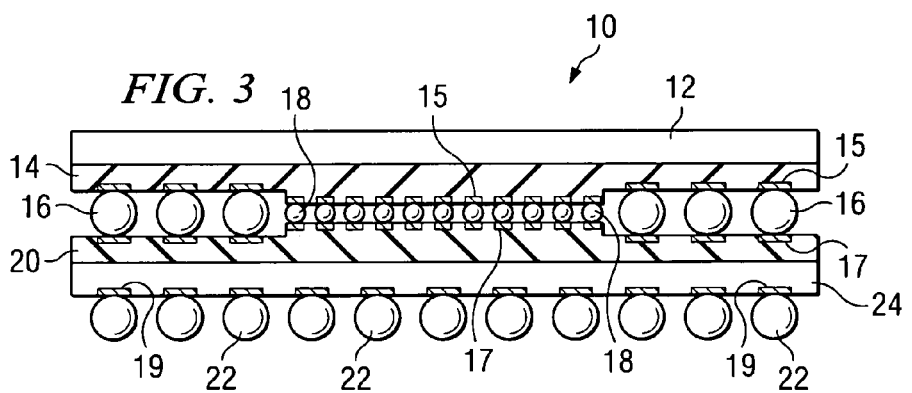
FIG. 3 illustrates a third embodiment of a semiconductor circuit manufactured in accordance with the invention.

FIG. 3 illustrates a third embodiment of a semiconductor circuit 10 constructed in accordance with the teachings of the invention. Again, all of the options discussed in connection with FIG. 1 may apply to the embodiment illustrated in FIG. 3. Thus, the discussion of FIG. 3 concentrates on the differences between the embodiment of FIG. 3 and the previously discussed embodiments of FIGS. 1 and 2.

In the embodiments of FIG. 1 and 2, either built up layer 14 or built up layer 20 had a substantially uniform thickness while the opposite built up layer 14 or 20 had a varying thickness. In this embodiment, both built up layer 14 and built up layer 20 have a varying thickness. The thickness of both built up layer 14 and built up layer 20 are varied such that die 12 and package substrate 24 are substantially coplanar with one another after they are connected together using large bumps 16 and small bumps 18. Accordingly, both built up layers 14 and 20 may be adjusted to accommodate the varying size of large bumps 16 and small bumps 18.

While the illustrated embodiments used two sizes of bumps (16 and 18), three or more bump sizes may be used without departing from the scope of the invention.

Large bumps 16 may be sized 20% larger or greater than small bumps 18. Accordingly, large bumps 16 may be 20%, 50%, 75%, 100%, 150%, 200%, 250%, 300%, 400%, or any percentage greater or in between these values without departing from the scope of the invention.

Figure 4:
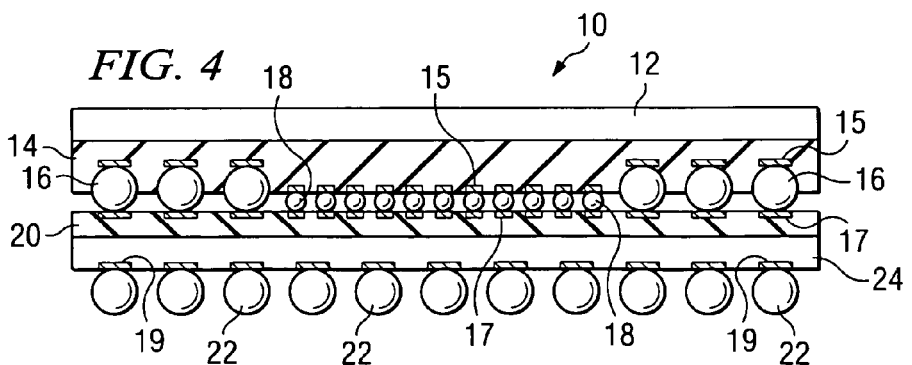
FIG. 4 illustrates a fourth embodiment of the invention in which bumps are positioned in holes in a built up layer on a semiconductor die.

In the illustrated embodiments of FIGS. 1, 2, and 3, large bumps 16 and small bumps 18 are bonded to contacts on the surface of built up layer 14 and built up layer 20. However, holes could be drilled and/or etched for either large bumps 16, small bumps 18, or both to fit into. FIGS. 4, 5, and 6 show variations of the embodiments of FIGS. 1, 2, and 3 with such drilled or etched holes for large bumps 16. The holes could be made in one or all of die 12, built up layer 14, built up layer 20, and/or package substrate 24 without departing from the scope of the invention.

FIG. 7 illustrates a method of manufacturing semiconductor circuit 10 in accordance with the invention. In step 26, a semiconductor die is fabricated along with built up layer 14. Any suitable technique may be used to fabricate die 12 and built up layer 14. There are existing techniques for performing each of these tasks. As noted above, built up layer 14 could be eliminated without departing from the scope of the invention.

In step 28, package substrate 24 may be fabricated with built up layer 20. Package substrate 24 may be any material (such as ceramic or plastic) without departing from the scope of the invention. As will be understood by those of skilled in the art, package substrate 24, built up layer 20, and built up layer 14 will likely contain conductive paths used to route signals from contacts on the upper surface of each such layer to the bottom surface of each such layer. As noted above, built up layer 20 can be omitted without departing from the scope of the invention. Also, in a wafer scale application, step 28 may be omitted without departing from the scope of the invention.

In step 30, large bumps 16 may be deposited on built up layer 14 and/or die 12. Existing techniques may be used for creating large bumps 16 such as placement of the bumps and/or a patterned etch. Any other suitable technique may also be used.

In step 32, small bumps 18 may be deposited using any suitable technique. The order of steps 30 and 32 may be reversed without departing from the scope of the invention as may the order of steps 26 and 28.

It should also be noted that in embodiments where holes are drilled and/or etched for either large bumps 16 or small bumps 18 to fit into, the order of the steps may vary. For example, such holes may be drilled in die 12 after the creation of built up layer 14 and the deposit of small bumps 18. The holes might then be drilled for large bumps 16 and the large bumps deposited after the holes are drilled.

Although the present invention has been described in detail it should be understood that various changes, substitutions, and alterations can be made hereto without departing from the spirit and scope of the invention as defined by the appended claims.

To aid the patent office and any readers of any patent issued on this application in interpreting the claims appended hereto applicants wish to note that they do not intend any of the appended claims to invoke paragraph 6 of 35 U.S.C. § 112 as it exists on the date of filing hereof unless the word "means for" or "step for" are used in the particular claim.

What is claimed is:

1. A semiconductor circuit comprising:
    a semiconductor die comprising a first plurality of electrical contacts and a second plurality of electrical contacts;
    a first plurality of conductive bumps wherein at least one bump in the first plurality is conductively connected to at least one of the first plurality of electrical contacts;
    a second plurality of conductive bumps, wherein at least one bump in the second plurality is conductively connected to at least one of the second plurality of electrical contacts;
    wherein the average size of the first plurality of conductive bumps is larger than the average size of the second plurality of conductive bumps;
    a substrate having a plurality of electrical contacts coupled to the first plurality of conductive bumps and the second plurality of conductive bumps; and
    a built up layer between the substrate and the second plurality of bumps wherein the first plurality of bumps are substantially coplanar with the second plurality of bumps relative to the semiconductor die.

2. The semiconductor circuit of claim 1,
    wherein the substrate comprises a package type selected from the group consisting of a ball grid array, a pin grid array, and a column grid array.

3. The semiconductor circuit of claim 1,
    wherein the substrate further comprises a plurality of recessed holes, each hole adapted to accept one of the first plurality of bumps.

4. The semiconductor circuit of claim 1,
    wherein the average size of the first plurality of conductive bumps is at least 100% larger than the average size of the second plurality of bumps.

5. The semiconductor circuit of claim 1,
    wherein the average size of the first plurality of conductive bumps is at least 200% larger than the average size of the second plurality of bumps.

6. A semiconductor circuit comprising:
    a semiconductor die comprising a first plurality of electrical contacts and a second plurality of electrical contacts;
    a first plurality of conductive bumps wherein at least one bump in the first plurality is conductively connected to at least one of the first plurality of electrical contacts;
    a second plurality of conductive bumps, wherein at least one bump in the second plurality is conductively connected to at least one of the second plurality of electrical contacts;
    wherein the average size of the first plurality of conductive bumps is at least 20% larger than the average size of the second plurality of conductive bumps;
    a substrate having a plurality of electrical contacts coupled to the first plurality of conductive bumps and the second plurality of conductive bumps; and
    a built up layer between the die and the second plurality of bumps; and wherein the first plurality of bumps are substantially coplanar with the second plurality of bumps with respect to their surfaces opposite the surface of the die.

7. A method of making a semiconductor circuit, comprising:
    providing a semiconductor die comprising a first plurality of electrical contacts and a second plurality of electrical contacts;
    conductively connecting to the die a first plurality of conductive bumps wherein at least one bump in the first plurality is conductively connected to at least one of the first plurality of electrical contacts;
    conductively connecting to the die a second plurality of conductive bumps, wherein at least one bump in the second plurality is conductively connected to at least one of the second plurality of electrical contacts;
    wherein the average size of the first plurality of conductive bumps is at least 20% larger than the average size of the second plurality of conductive bumps;
    providing a substrate having a plurality of electrical contacts and coupling the electrical contacts to the first plurality of conductive bumps and the second plurality of conductive bumps; and
    forming a built-up layer between the substrate and the second plurality of bumps such that the first plurality of bumps are substantially coplanar with the second plurality of bumps relative to the semiconductor die.

* * * * *

UNITED STATES PATENT AND TRADEMARK OFFICE
CERTIFICATE OF CORRECTION

PATENT NO. : 7,084,500 B2  
APPLICATION NO. : 10/696017  
DATED : August 1, 2006  
INVENTOR(S) : Leland Swanson et al.

Page 1 of 1

It is certified that error appears in the above-identified patent and that said Letters Patent is hereby corrected as shown below:

On the Title Page, Item (75)  
Correct the first named inventor to: --Swanson-- instead of "Swnson"

Signed and Sealed this

Twentieth Day of May, 2008

JON W. DUDAS  
*Director of the United States Patent and Trademark Office*